United States Patent
Li

(10) Patent No.: US 9,922,980 B2
(45) Date of Patent: Mar. 20, 2018

(54) METHOD AND DEVICE FOR REDUCING FINFET SELF-HEATING EFFECT

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 15/280,482

(22) Filed: Sep. 29, 2016

(65) Prior Publication Data
US 2017/0179129 A1 Jun. 22, 2017

(30) Foreign Application Priority Data
Dec. 22, 2015 (CN) .......................... 2015 1 0969841

(51) Int. Cl.
| | |
|---|---|
| *H01L 27/092* | (2006.01) |
| *H01L 21/02* | (2006.01) |
| *H01L 21/225* | (2006.01) |
| *H01L 21/311* | (2006.01) |
| *H01L 21/8238* | (2006.01) |
| *H01L 23/373* | (2006.01) |
| *H01L 29/165* | (2006.01) |

(Continued)

(52) U.S. Cl.
CPC .... *H01L 27/0924* (2013.01); *H01L 21/02115* (2013.01); *H01L 21/2255* (2013.01); *H01L 21/31111* (2013.01); *H01L 21/762* (2013.01); *H01L 21/823821* (2013.01); *H01L 23/3732* (2013.01); *H01L 29/165* (2013.01); *H01L 29/167* (2013.01); *H01L 29/41783* (2013.01); *H01L 29/66795* (2013.01); *H01L 29/785* (2013.01); *H01L 29/7851* (2013.01)

(58) Field of Classification Search
CPC combination set(s) only.
See application file for complete search history.

(56) References Cited

U.S. PATENT DOCUMENTS

| | | |
|---|---|---|
| 8,481,410 B1 | 7/2013 | LiCausi et al. |
| 2005/0056892 A1 | 3/2005 | Seliskar |

(Continued)

OTHER PUBLICATIONS

European Application No. 16204241.0, Extended European Search Report dated May 24, 2017, 7 pages.

*Primary Examiner* — Mamadou Diallo
(74) *Attorney, Agent, or Firm* — Kilpatrick Townsend & Stockton LLP

(57) ABSTRACT

A method of manufacturing a semiconductor device includes providing a semiconductor substrate, forming a diamond film on the substrate, etching the diamond film to form a first trench that extends to the substrate, epitaxially growing a first semiconductor material in the first trench to form a first semiconductor fin structure, and removing an upper portion of the diamond film to expose an upper portion of the first semiconductor fin structure.

19 Claims, 7 Drawing Sheets

(51) Int. Cl.
*H01L 29/167* (2006.01)
*H01L 29/417* (2006.01)
*H01L 29/66* (2006.01)
*H01L 29/78* (2006.01)
*H01L 21/762* (2006.01)

(56) References Cited

U.S. PATENT DOCUMENTS

| | | |
|---|---|---|
| 2007/0054467 A1 | 3/2007 | Currie et al. |
| 2008/0001234 A1* | 1/2008 | Cheng ............... H01L 21/8249 257/370 |
| 2008/0048262 A1 | 2/2008 | Lee et al. |
| 2009/0173950 A1 | 7/2009 | West et al. |
| 2015/0228761 A1* | 8/2015 | Cheng ............... H01L 29/66795 257/365 |
| 2015/0255456 A1 | 9/2015 | Jacob et al. |
| 2015/0259790 A1* | 9/2015 | Newman ............... C23C 16/27 423/446 |
| 2015/0311138 A1 | 10/2015 | Lee et al. |
| 2015/0333145 A1* | 11/2015 | Chudzik ........... H01L 29/66795 257/401 |
| 2016/0268413 A1* | 9/2016 | Basker ............... H01L 29/785 |

* cited by examiner

METHOD AND DEVICE FOR REDUCING FINFET SELF-HEATING EFFECT

CROSS-REFERENCES TO RELATED APPLICATIONS

This application claims priority to Chinese patent application No. 201510969841.8, filed on Dec. 22, 2015, the content of which is incorporated herein by reference in its entirety.

BACKGROUND OF THE INVENTION

The present invention relates to the field of semiconductor technology. Specifically, embodiments of the invention are directed to semiconductor device structures and manufacturing methods.

As device dimensions shrink, FinFET (Fin Field Effect Transistor, FinFET) has been widely used. However, compared with planar transistor devices, the FinFET three-dimensional structure is more complex. The inventor has identified that the self-heating effect is more serious with FinFET three-dimensional structures, thus affecting the stability of the device.

BRIEF SUMMARY OF THE INVENTION

Embodiments of the present invention provide a novel semiconductor device and manufacturing method with reduced self-heating and improved device cooling, which can improve the stability of the device.

According to some embodiments of the present invention, a method of manufacturing a semiconductor device includes providing a semiconductor substrate, forming a diamond film on the substrate, etching the diamond film to form a first trench that extends to the substrate, epitaxially growing a first semiconductor material in the first trench to form a first semiconductor fin structure, and removing an upper portion of the diamond film to expose an upper portion of the first semiconductor fin structure.

In an embodiment, the above method also includes forming a first gate structure on a portion of the first semiconductor fin structure, the first gate structure including a gate dielectric overlying the first semiconductor fin structure and a first gate electrode overlying the first gate dielectric.

In an embodiment, the above method also includes forming a spacer material on side surfaces of a portion of first semiconductor fin structure not covered by the first gate structure, and forming an elevated source/drain region on an upper surface of the first semiconductor fin structure not covered by the first gate structure.

In an embodiment, the above method also includes doping the first semiconductor fin structure with a doping concentration that decreases from a lower portion extending to a top portion.

In an embodiment, the top portion is an intrinsic semiconductor material.

In an embodiment, the above method also includes etching the diamond film to form a second trench that extends to the substrate, epitaxially growing a second semiconductor material in the second trench to form a second semiconductor fin structure, and removing an upper portion of the diamond film to expose an upper portion of the second semiconductor fin structure.

In an embodiment, forming the first and the second semiconductor fin structures includes etching the diamond film to form the first and the second trenches that extend to the substrate, forming an oxide layer at the bottom of the first and second trenches using wet solvent, removing the oxide layer from the bottom of the first trench, forming the first semiconductor material in the first trench to form the first semiconductor fin structure using a graded epitaxy process to dope the first semiconductor fin structure with boron (B) with higher doping concentration in a lower portion of the first semiconductor fin structure and a lower doping concentration in a higher portion of the first semiconductor fin structures.

In an embodiment, the above method also includes forming an oxide layer on top of the first semiconductor fin structure using a wet solvent process, removing the oxide layer from the bottom of the second trench, forming the second semiconductor material in the second trench to form the second semiconductor fin structure using a graded epitaxy process to dope the second semiconductor fin structure with phosphorus (P) with higher doping concentration in a lower portion of the second semiconductor fin structure and a lower doping concentration in a higher portion of the second semiconductor fin structures.

In an embodiment, the higher portions of the first and second fin structure are intrinsic semiconductor material.

In an embodiment, the above method also includes forming a first gate structure on a portion of the first semiconductor fin structure and a portion of the second semiconductor fin structure, the first gate structure including a gate dielectric and a first gate electrode overlying the first gate dielectric.

In an embodiment, the above method also includes forming a sacrificial layer on a top surface and side surfaces of the first and the second semiconductor fin structures not covered by the first gate structure; removing the sacrificial layer on the top surface of the first semiconductor fin structure and forming elevated source/drain regions on the exposed top surface of the first semiconductor fin structure; and removing the sacrificial layer on the top surface of the second semiconductor fin structure and forming elevated source/drain regions on the exposed top surface of the second semiconductor fin structure.

In an embodiment, the above method also includes forming an interlayer dielectric layer to cover the first gate structure, the diamond film, and the elevated source/drain regions; planarizing the interlayer dielectric to expose the upper surface of the first gate structure; removing the first gate structure to form a recess to expose a portion of the semiconductor fin structures, and forming a second gate structure on a surface of the exposed portion of the semiconductor fin structures.

In an embodiment, forming the second gate structure includes forming an interface layer over the exposed surface of the semiconductor fin structures in the recess; forming a second gate dielectric layer and the work function adjustment layer on the interfacial layer; and depositing a second gate material on the work function adjustment layer.

According to some embodiments of the present invention, a semiconductor device includes a semiconductor substrate, a first semiconductor fin disposed on the substrate, and a diamond film disposed on both sides of the first semiconductor fin and covering a lower portion of the first semiconductor fin.

In an embodiment, the above device also includes a first gate structure on the first semiconductor fin, the first gate structure including a first gate dielectric layer overlying the first semiconductor fin and a first gate electrode over the first gate dielectric layer.

In an embodiment, the above device also includes elevated source/drain regions on a top surface of the first semiconductor fin.

In an embodiment, a lower portion of the first semiconductor fin has a higher doping concentration than a higher portion of the first semiconductor fin.

In an embodiment, the higher portion of the first semiconductor fin is an intrinsic semiconductor material.

In an embodiment, the above device also includes a second semiconductor fin disposed on the substrate, the diamond film being disposed on both sides of the second semiconductor fin and covering a lower portion of the second semiconductor fin.

In an embodiment, the above device also includes elevated source/drain regions including a silicon (Si) material on a top surface of the first semiconductor fin forming an N-type device, and elevated source/drain regions including a silicon-germanium (SiGe) material on a top surface of the second semiconductor fin forming a P-type device.

A further understanding of the nature and advantages of the present invention may be realized by reference to the remaining portions of the specification and the drawings.

DETAILED DESCRIPTION OF THE INVENTION

Figure 1:
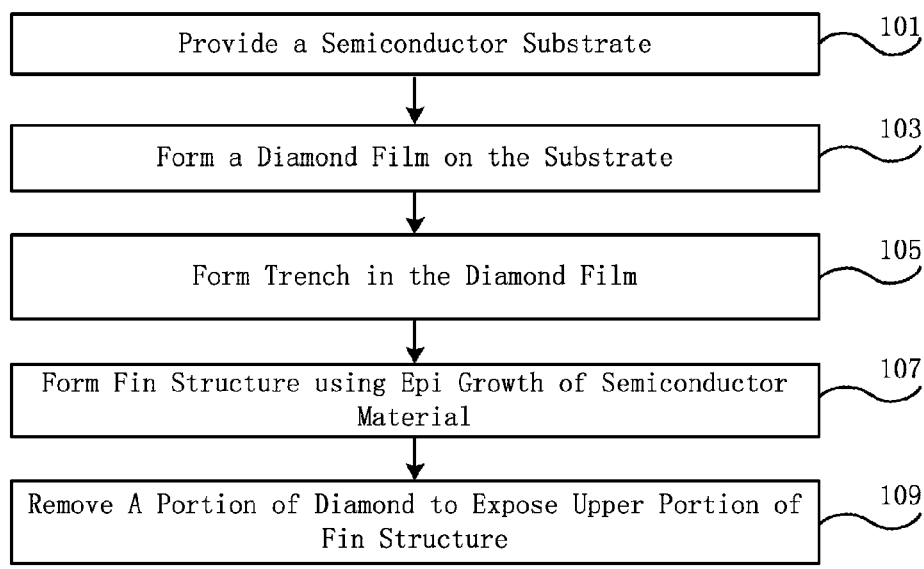
FIG. 1 is a simplified flow chart of a method of manufacturing a semiconductor device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the sizes of the various components shown in the drawings are not necessarily drawn in actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

The inventors have studied FinFET self-heating effects and found that the fin structures in the existing FinFET are isolated by oxides, which have low thermal conductivity and are not conducive to heat transfer, and therefore can exacerbate the self-heating effects. Embodiments of the present invention provide a method and device structure that can reduce FinFET self-heating effects.

FIG. 1 is a simplified flow chart of a method of manufacturing a semiconductor device of an embodiment of the present disclosure. As shown in FIG. 1, the method includes the following steps:

In step 101, a semiconductor substrate is provided.

In step 103, a diamond film is formed on a substrate.

In step 105, the diamond film is etched to form a trench that extends to the substrate.

In step 107, a first semiconductor material is epitaxially grown in the trench to form a first semiconductor fin structure.

In step 109, an upper portion of the diamond film is removed to expose an upper portion of the first semiconductor fin structure.

Figure 2:
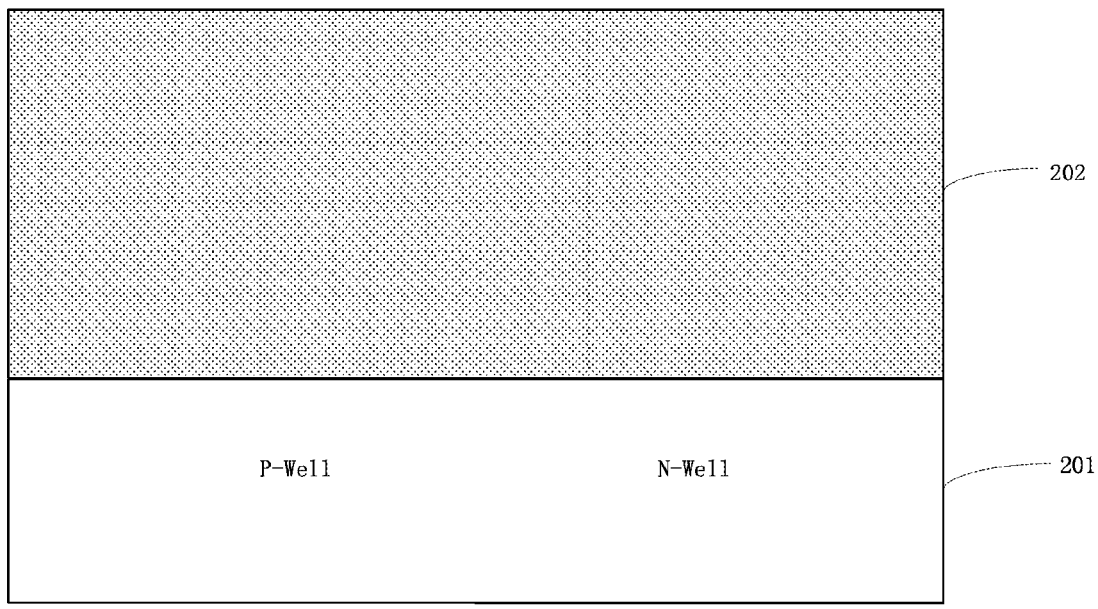
FIG. 2 shows a schematic cross-sectional view of forming a diamond film on a substrate according to an embodiment of the present invention.

FIG. 2 shows a diamond film 202 formed on a substrate 201. Here, for example, semiconductor substrate 201 may be a silicon (Si) substrate, a silicon on insulator (SOI) substrate, and the like. Substrate 201 may include well regions, e.g., a P-well and N-well. Diamond film 202 can be deposited on a single crystal silicon substrate, for example, using a plasma chemical vapor deposition (PECVD), such as microwave PECVD, with methanol and hydrogen mixed gas and acetone and hydrogen mixed gas as the source gas. The deposited diamond film can have a thickness of a few hundred nm, for example 100-200 nm.

Figure 3:
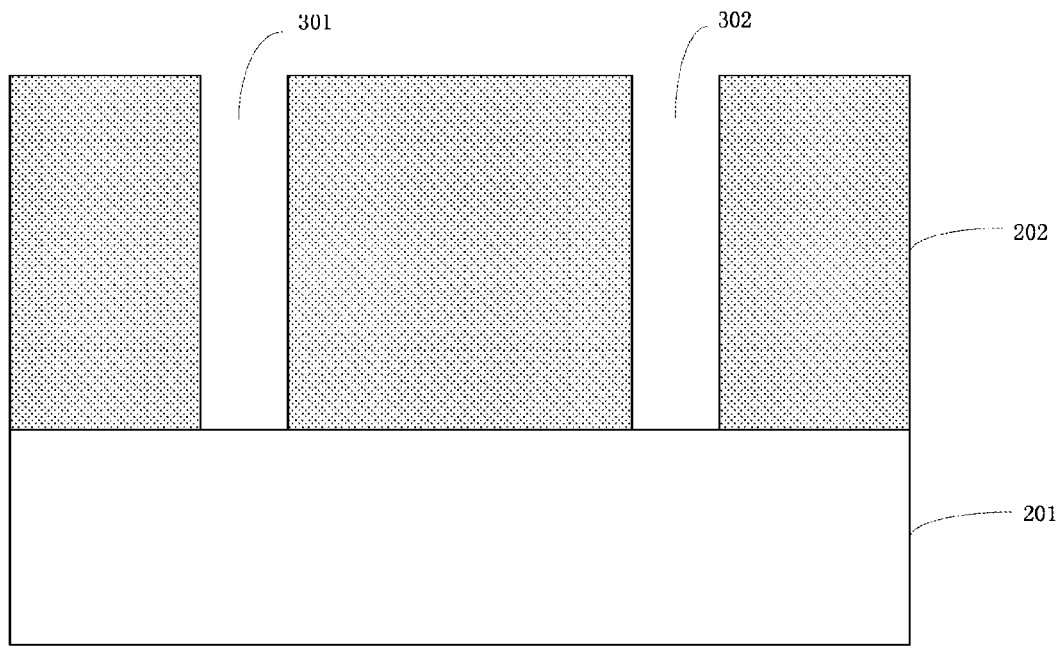
FIG. 3 shows a schematic cross-sectional view of forming trenches in the diamond film according to an embodiment of the present invention.

In step 105, the diamond film is etched, e.g., using oxygen plasma etching, to form a trench extending into the substrate. FIG. 3 shows two trenches, i.e., a first trench 301 and second trench 302. However, it is understood that there can be more than two trenches.

Figure 4:
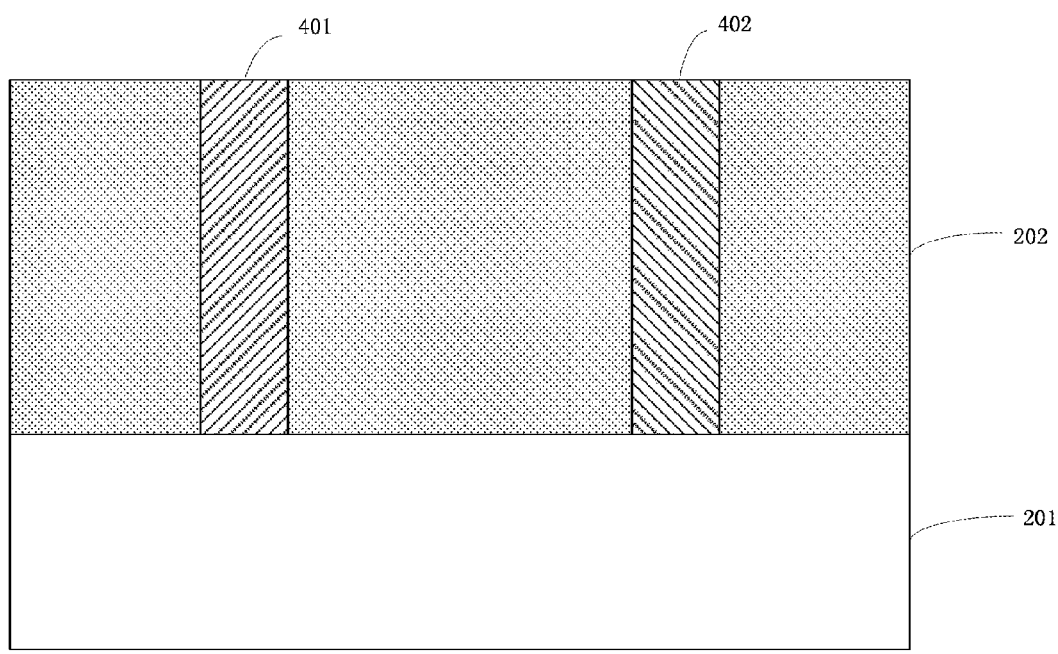
FIG. 4 shows a schematic cross-sectional view of forming a semiconductor fin according to an embodiment of the present invention.

Then, at step 107, a semiconductor material is epitaxially grown in the trenches to form the semiconductor fin structures. As shown in FIG. 4, a first semiconductor material is epitaxially grown in the first trench 301 in substrate 201 to form a first semiconductor fin or fin structure 401. The first semiconductor fin 401 can be used to form an N-type semiconductor device. A second semiconductor material can be epitaxially grown in the second trench 302 in substrate 201 to form a second semiconductor fin or fin structure 402. The second semiconductor fin 402 can be used to form a P-type semiconductor device. In one embodiment, the first or second semiconductor material can be epitaxially grown with in-situ doping with boron (B) or phosphorus (P).

In an embodiment, forming the first and the second semiconductor fin structures includes etching the diamond film to form the first and the second trenches that extend to the substrate, forming an oxide layer at the bottom of the first and second trenches using wet solvent, removing the oxide layer from the bottom of the first trench, forming the first semiconductor material in the first trench to form the first semiconductor fin structure using a graded epitaxy process to dope the first semiconductor fin structure with boron (B) with higher doping concentration in a lower portion of the first semiconductor fin structure and a lower doping concentration in a higher portion of the first semiconductor fin structure.

In an embodiment, the above method also includes forming an oxide layer on top of the first semiconductor fin structure using a wet solvent process, removing the oxide layer from the bottom of the second trench, forming the second semiconductor material in the second trench to form the second semiconductor fin structure using a graded epitaxy process to dope the second semiconductor fin structure with phosphorus (P) with higher doping concentration in a lower portion of the second semiconductor fin structure and a lower doping concentration in a higher portion of the second semiconductor fin structure.

In an embodiment, the formed semiconductor fins each can have a first portion and a second portion located on top of the first portion, wherein the average doping concentration of the first portion is higher than an average doping concentration of the second portion. In some embodiments, the second portion may be intrinsic semiconductor material. In another embodiment, the doping concentration of the semiconductor fin gradually decreases from the bottom to the top. Put another way, the doping concentration in the bottom portion of the semiconductor fin is substantially greater than the doping concentration in the top portion of the semiconductor fin. Thus, after the subsequent formation of the semiconductor device, the lower doping concentration can reduce the punch-through effect between the source and drain regions, and enhance the channel carrier mobility.

Figure 5:
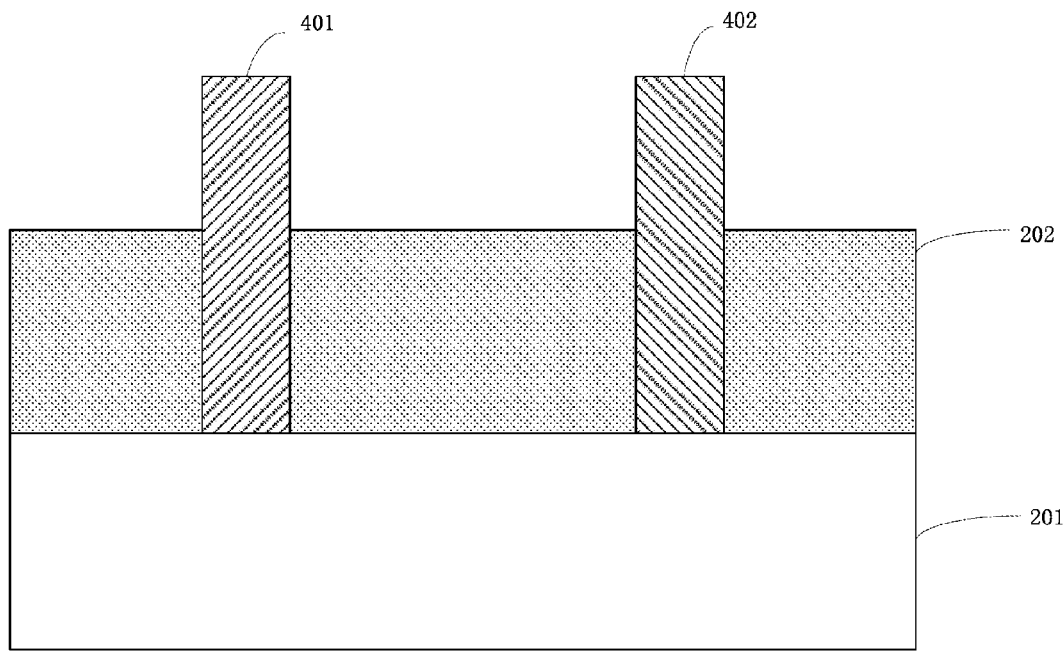
FIG. 5 shows a schematic cross-sectional view of forming a semiconductor fin according to an embodiment of the present invention.

Next, in step 109, a portion of the diamond film is removed to expose the upper portion of the semiconductor fins, as shown in FIG. 5.

As described above, a method of manufacturing a semiconductor device is described according to some embodiments. It should be noted that, as used herein, unless otherwise noted, the "cross-sections" are taken across the gate structure.

Figure 6:
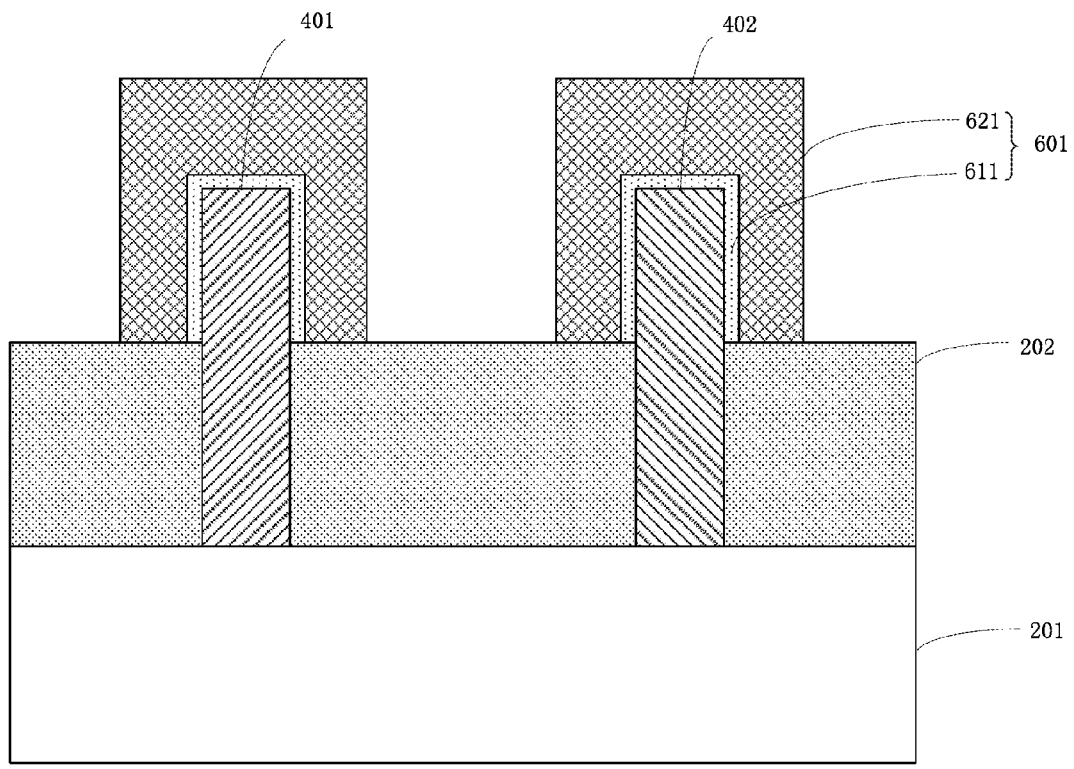
FIG. 6 shows a schematic cross-sectional view of forming the first gate structure according to an embodiment of the present invention.

After step 109 shown in FIG. 1, in some embodiments, the manufacturing method may further include the following steps. For example, a first gate structure can be formed on the semiconductor fins, e.g., first fin structure 401 and second fin structure 402. As shown in FIG. 6, the gate structure 601 includes a first gate dielectric layer 611 and the first gate electrode 621 on the first gate. Here, the first gate structure 601 may also be used as a dummy gate structure. The first gate dielectric layer 611 may be an oxide layer, and the first gate electrode 621 may be polysilicon. If the first gate structure 601 is a dummy-gate structure, the dummy gate structure will be replaced by a replacement gate structure, or a second gate structure.

Figure 7:
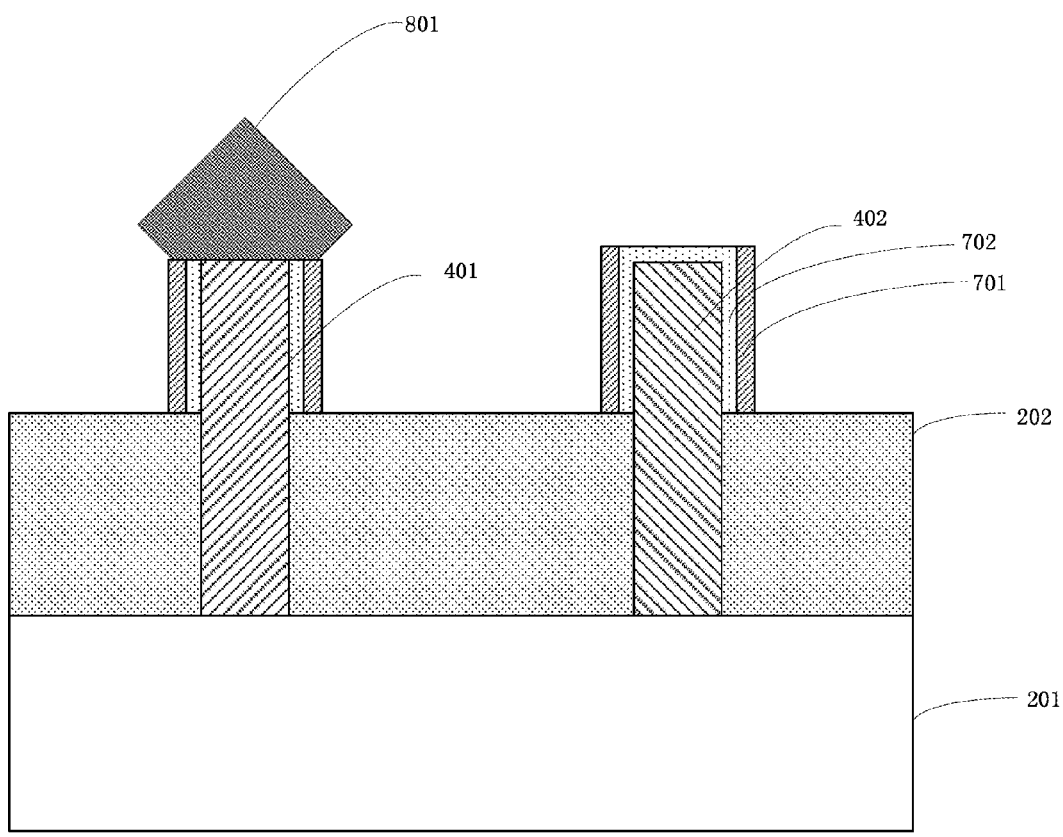
FIG. 7 shows a schematic cross-sectional view of forming spacers and elevated source/drain regions according to an embodiment of the present invention.

Thereafter, spacers may be formed for the first gate structure. FIG. 7 shows a partial cross-sectional view along the semiconductor fin that is not covered by the first gate structure. From a top view (not shown), the first gate structure may overlie a center portion of a fin structure. Both end portions of the fin structure are not covered by the first gate structure and can be used as source/drain regions for the transistor. As shown in FIG. 7, spacers 701 also cover the sidewall portions of the semiconductor fin 402 that are not covered by the first gate structure.

Figure 8:
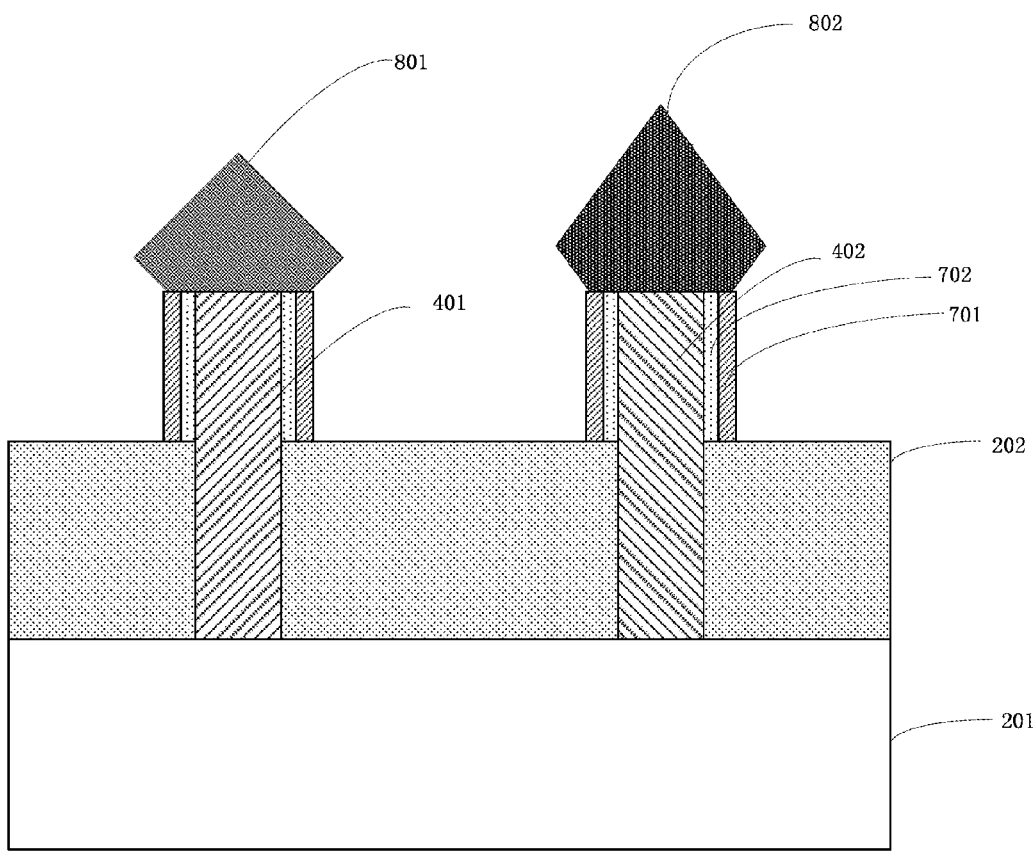
FIG. 8 shows a schematic cross-sectional view of forming spacers and elevated source/drain regions according to an embodiment of the present invention.

Then, a semiconductor material (e.g., Si or SiGe) can be epitaxially grown on the surface of the semiconductor fin on both sides of the first gate structure to form elevated active regions (including source and/or drain regions). As shown in FIGS. 7 and 8, for the N-type semiconductor device, a silicon region 801 can be epitaxially grown on the surface of the first semiconductor fin to form the elevated or raised source/drain regions 801. As shown in FIG. 8, for the P-type semiconductor device, a SiGe region 802 can be epitaxially grown on the surface of the second semiconductor fin on both sides of the first gate structure to form the elevated source/drain regions 802. SiGe region 802 can facilitate the introduction of stress to the device. In addition, in-situ doping can be included in the epitaxial growth to dope the elevated source/drain regions with, e.g., phosphorus (P) or boron (B).

In some embodiments, both the N-type device and P-type device can be formed. As shown in FIG. 7, a sacrificial layer 702, such as an oxide layer, can be formed on the upper and side surfaces of first semiconductor fin 401 and second semiconductor fin 402 on both sides of the first gate structure. Then, spacers 701 are formed on the side surfaces of the fins. For the N-type device, the sacrificial layer 702 on the top surfaces of fin 401 is removed, and a semiconductor material, e.g., Si, is epitaxially grown on fin 401 to form elevated active region 801. As shown in FIG. 8, for the P-type device, the sacrificial layer 702 on the top surfaces of fin 402 is removed, and a semiconductor material, e.g., SiGe, is epitaxially grown on fin 402 to form elevated active region 802. Next, an interlayer dielectric 901 can be formed on the first gate structure, diamond film, and elevated source/drain regions.

Figure 9:
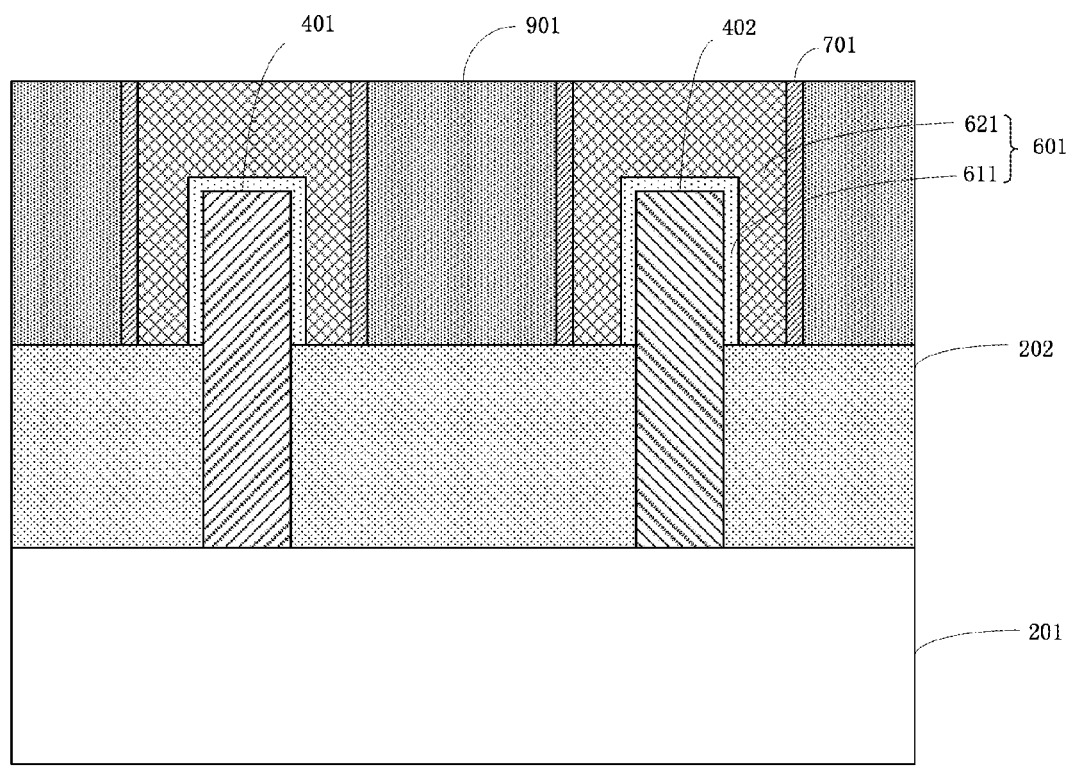
FIG. 9 shows a schematic cross-sectional view of forming the interlayer dielectric layer according to an embodiment of the present invention.
Figure 10:
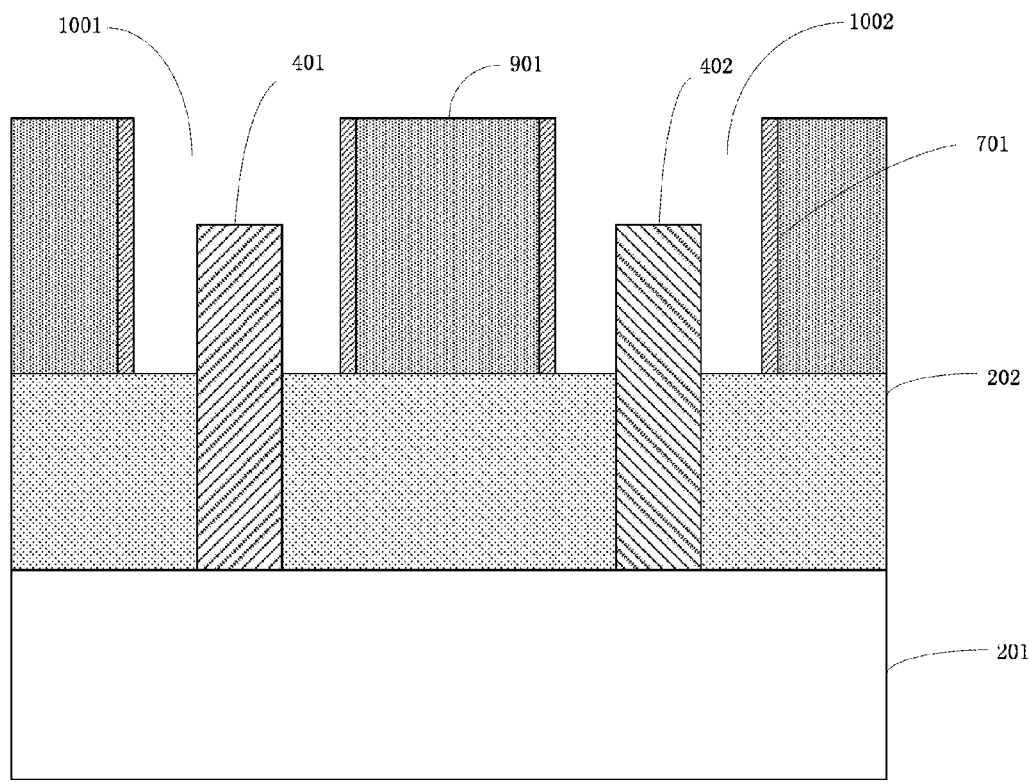
FIG. 10 shows a schematic cross-sectional view of the removal of the first gate structure according to an embodiment of the present invention.
Figure 11:
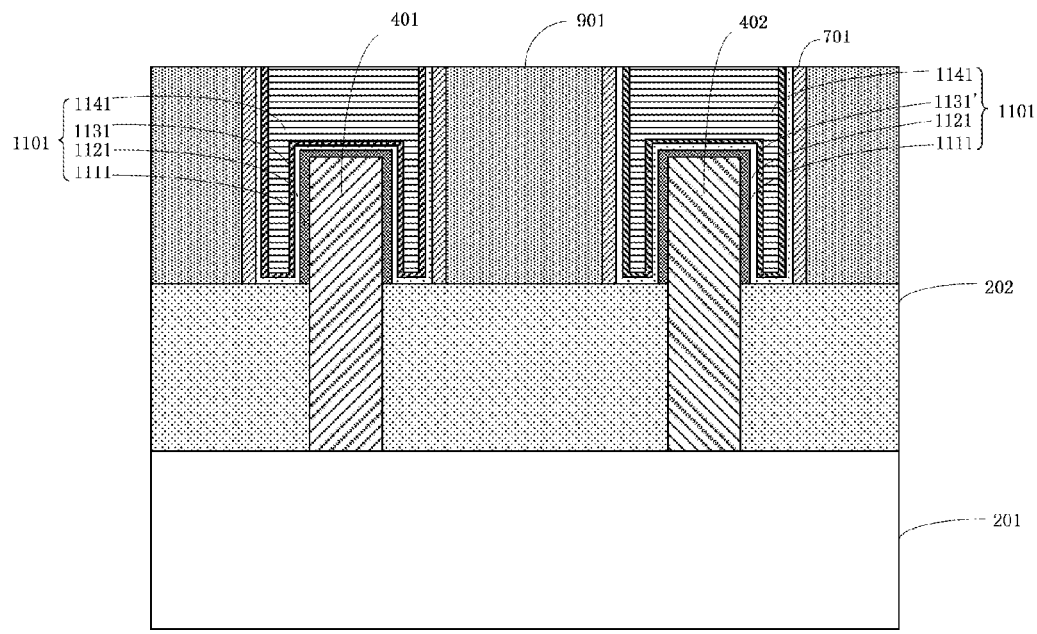
FIG. 11 shows a schematic cross-sectional view of forming the second gate structure according to an embodiment of the present invention.

In alternative embodiments, as shown in FIG. 9, interlayer dielectric 901 is planarized to expose an upper surface of the first gate structure 601. At this time, the first gate structure can be replaced with a gate electrode material with desired properties. As shown in FIG. 10, the first gate structure 601 is removed to form cavities 1001 and 1002 to expose portions of the fin structures. Next, a second gate structure can be formed to replace the first gate structure. In an embodiment, as shown in FIG. 11, a first interface layer 1111 is formed on fin structure 401. First interface layer 1111 can be a silicon oxide layer formed by means of thermal oxidation. Then, a gate dielectric layer 1121 and a work function tuning layer 1131 can be formed. Here, the second gate dielectric layer 1121 is preferably a high-K dielectric material. The work function tuning or regulating layer for the N-channel device (also referred to as N-type work function adjustment layer) 1131 may include one or more of materials TiAl, TiCAl, TiNAl, and TiSiAl. Thereafter, a second gate electrode material 1141, e.g., a metal gate material, is deposited to fill first recess 1001, thereby forming a second gate structure 1101.

Similarly, the second gate structure 1101 is formed in the second semiconductor fin. In the second recess 1002, an interface layer 1111 is formed on the surface of the exposed portion of the second semiconductor fin 401. Then, a gate dielectric layer 1121 and a second work function tuning layer 1131' are formed. A second gate material 1141, e.g., a metal gate material, is deposited on work function adjustment layer 1131' to fill second recesses 1002 to form a second gate structure. Here, the work function adjustment, tuning, or regulating layer 1131' for the P-channel device (also called a P-type work function adjustment layer) may be $Ti_xN_y$ (typically a TiN), TaN, TaC, and/or other materials.

In the above example, the work function adjustment layer is different in the N-type device or P-type device. In some embodiments, the interface layer, gate dielectric layer, and second gate material can be different for the N-type device and P-type device.

Embodiments of the present invention provide a novel semiconductor device and manufacturing method. High thermal conductivity of diamond films are used to isolate the semiconductor fins. The heat generated when the semiconductor device operates can be quickly dissipated to the substrate and reduce the self-heating effect and cooling devices, thereby improving the stability of the device.

The present disclosure also discloses a semiconductor device. Referring to FIG. 5, the semiconductor device includes a semiconductor substrate 201, a first semiconductor fin 401 located on the semiconductor substrate, and a diamond film disposed on both sides of the first semiconductor fin and covering a lower portion of the first semiconductor fin. In some embodiments, the semiconductor fin can include a first portion and a second portion located on the first portion, wherein the average doping concentration of the first portion is higher than an average dopant concentration of the second portion. In a specific embodiment, the second portion may be intrinsic semiconductor material. In another embodiment, the doping concentration of the semiconductor fin gradually decreases from the bottom to the top. In this case, the doping concentration in the bottom of the semiconductor fin is substantially greater than the doping concentration at the top; thus, in the subsequently formed semiconductor device, the punch-through effect between the source and drain regions can be reduced, and the channel carrier mobility can be improved.

In an embodiment, referring to FIG. 6, the device may further include a first gate structure 601 on the first semiconductor fin, the first gate structure including a first gate dielectric layer 611 overlying the first semiconductor fin and a first gate electrode 621 over the first gate dielectric layer.

In an embodiment, referring to FIG. 7, the device may further include a spacer 701 on first gate structure 601. Spacer 701 also covers portions of the semiconductor fin, e.g., a first semiconductor fin 401 not the sidewall portion of the first gate structure covered.

In an embodiment, referring to FIG. 8, the device may further include elevated source/drain regions on the surface of the semiconductor fin structure. The elevated source/drain regions can include epitaxially grown Si or SiGe 801 or 802.

In an embodiment, referring to FIG. 11, the device includes a first semiconductor fin 401 and a second semiconductor fin 402. One of the fins can be for forming an N-type semiconductor device, and the other fin can be for forming a P-type semiconductor device.

In one embodiment, referring to FIG. 11, the device further includes a second gate structure or replacement gate structure 1101 on the semiconductor fins. The second gate structure includes an interface layer 1111, a gate dielectric layer 1121 on the interface layer, a work function adjustment layer 1131 or 1131' on the gate dielectric layer, and a second gate electrode 1141 on the work function adjustment layer. Work function adjustment layers 1131 and 1131' can be selected for N-type device and P-type device, respectively.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A method of manufacturing a semiconductor device, comprising:
    providing a semiconductor substrate;
    forming a diamond film on the substrate;
    etching the diamond film to form a first trench that extends to the substrate;
    epitaxially growing a first semiconductor material in the first trench to form a first semiconductor fin structure;
    doping the first semiconductor fin structure with a doping concentration that decreases from a lower portion extending to an upper portion of the first semiconductor fin structure; and
    removing an upper portion of the diamond film to expose an upper portion of the first semiconductor fin structure.

2. The method of claim 1, further comprising:
    forming a first gate structure on a portion of the first semiconductor fin structure, the first gate structure including a gate dielectric overlying the first semiconductor fin structure and a first gate electrode overlying the first gate dielectric.

3. The method of claim 2, further comprising:
    forming a spacer material on side surfaces of a portion of the first semiconductor fin structure not covered by the first gate structure; and
    forming an elevated source/drain region on an upper surface of the first semiconductor fin structure not covered by the first gate structure.

4. The method of claim 1, wherein the top portion is an intrinsic semiconductor material.

5. The method of claim 1, further comprising:
    etching the diamond film to form a second trench that extends to the substrate;
    epitaxially growing a second semiconductor material in the second trench to form a second semiconductor fin structure; and
    removing an upper portion of the diamond film to expose an upper portion of the second semiconductor fin structure.

6. The method of claim 5, wherein forming the first and the second semiconductor fin structures comprises:
    etching the diamond film to form the first and the second trenches that extend to the substrate;
    forming an oxide layer at the bottom of the first and second trenches using wet solvent;
    removing the oxide layer from the bottom of the first trench; and
    forming the first semiconductor material in the first trench to form the first semiconductor fin structure using a graded epitaxy process to dope the first semiconductor fin structure with boron (B) with higher doping concentration in the lower portion of the first semiconductor fin structure and a lower doping concentration in the upper portion of the first semiconductor fin structure.

7. The method of claim 6, further comprising:
    forming an oxide layer on top of the first semiconductor fin structure using a wet solvent process;
    removing the oxide layer from the bottom of the second trench;
    forming the second semiconductor material in the second trench to form the second semiconductor fin structure using a graded epitaxy process to dope the second semiconductor fin structure with phosphorus (P) with higher doping concentration in a lower portion of the second semiconductor fin structure and a lower doping concentration in the upper portion of the second semiconductor fin structure.

8. The method of claim 7, wherein the higher upper portions of the first and second fin structures are of an intrinsic semiconductor material.

9. The method of claim 5, further comprising:
forming a first gate structure on a portion of the first semiconductor fin structure and a portion of the second semiconductor fin structure, the first gate structure including a gate dielectric and a first gate electrode overlying the first gate dielectric.

10. The method of claim 9, further comprising:
forming a sacrificial layer on a top surface and side surfaces of the first and the second semiconductor fin structures not covered by the first gate structure;
removing the sacrificial layer on the top surface of the first semiconductor fin structure and forming elevated source/drain regions on the exposed top surface of the first semiconductor fin structure; and
removing the sacrificial layer on the top surface of the second semiconductor fin structure and forming elevated source/drain regions on the exposed top surface of the second semiconductor fin structure.

11. The method of claim 10, further comprising:
forming an interlayer dielectric layer to cover the first gate structure, the diamond film, and the elevated source/drain regions;
planarizing the interlayer dielectric to expose the upper surface of the first gate structure;
removing the first gate structure to form a recess to expose a portion of the semiconductor fin structures; and
forming a second gate structure on a surface of the exposed portion of the semiconductor fin structures.

12. The method of claim 11, wherein forming the second gate structure comprises:
forming an interface layer over the exposed surface of the semiconductor fin structures in the recess;
forming a second gate dielectric layer and the work function adjustment layer on the interfacial layer; and
depositing a second gate material on the work function adjustment layer.

13. A semiconductor device, comprising:
a semiconductor substrate;
a first semiconductor fin disposed on the substrate; and
a diamond film disposed on both sides of the first semiconductor fin and covering a lower portion of the first semiconductor fin; and
elevated source/drain regions on a top surface of the first semiconductor fin.

14. The device of claim 13, further comprising:
a first gate structure on the first semiconductor fin, the first gate structure including a first gate dielectric layer overlying the first semiconductor fin and a first gate electrode over the first gate dielectric layer.

15. The device of claim 13, wherein a lower portion of the first semiconductor fin has a higher doping concentration than a higher portion of the first semiconductor fin.

16. The device of claim 15, wherein the higher portion of the first semiconductor fin is an intrinsic semiconductor material.

17. The device of claim 13, further comprising:
a second semiconductor fin disposed on the substrate, the diamond film being disposed on both sides of the second semiconductor fin and covering a lower portion of the second semiconductor fin.

18. The device of claim 17, wherein the elevated source/drain regions comprise a silicon (Si) material on a top surface of the first semiconductor fin forming an N-type device, the device further comprising:
elevated source/drain regions including a silicon-germanium (SiGe) material on a top surface of the second semiconductor fin forming a P-type device.

19. A semiconductor device, comprising:
a semiconductor substrate;
a semiconductor fin disposed on the substrate;
a diamond film disposed on both sides of the semiconductor fin and covering a lower portion of the semiconductor fin; and
a lower portion of the semiconductor fin has a higher doping concentration than a higher portion of the semiconductor fin.

\* \* \* \* \*